United States Patent
Huang et al.

(10) Patent No.: US 6,770,959 B2
(45) Date of Patent: Aug. 3, 2004

(54) SEMICONDUCTOR PACKAGE WITHOUT SUBSTRATE AND METHOD OF MANUFACTURING SAME

(75) Inventors: Chien-Ping Huang, Hsinchu Hsien (TW); Raymond J. M. Jao, Miao-Li Hsien (TW)

(73) Assignee: Silconware Precision Industries Co., Ltd., Taichung (TW)

( * ) Notice: Subject to any disclaimer, the term of this patent is extended or adjusted under 35 U.S.C. 154(b) by 4 days.

(21) Appl. No.: 09/736,225

(22) Filed: Dec. 15, 2000

(65) Prior Publication Data

US 2002/0074672 A1 Jun. 20, 2002

(51) Int. Cl.[7] .................... H01L 23/495; H01L 23/06
(52) U.S. Cl. .............. 257/676; 257/666; 257/787; 257/784; 257/783; 257/690
(58) Field of Search ................. 257/676, 666, 257/787, 784, 690, 783

(56) References Cited

U.S. PATENT DOCUMENTS

| | | | |
|---|---|---|---|
| 5,866,948 A | * | 2/1999 | Murakami et al. .......... 257/778 |
| 5,869,905 A | | 2/1999 | Takebe ...................... 257/787 |
| 5,976,912 A | * | 11/1999 | Fukutomi et al. .......... 438/110 |
| 6,001,671 A | * | 12/1999 | Fjelstad .................... 438/112 |
| 6,111,306 A | * | 8/2000 | Kawahara et al. .......... 257/666 |
| 6,191,494 B1 | * | 2/2001 | Ooyama et al. ........... 257/796 |
| 6,455,926 B2 | * | 9/2002 | Ho ........................... 257/678 |

FOREIGN PATENT DOCUMENTS

| | | | | |
|---|---|---|---|---|
| JP | 4-148553 | * | 5/1992 | ................ 23/12 |

* cited by examiner

*Primary Examiner*—Steven Loke
*Assistant Examiner*—Nitin Parekh
(74) *Attorney, Agent, or Firm*—Bacon & Thomas

(57) ABSTRACT

A semiconductor package without substrate and method of manufacturing the same includes providing an interim substrate which has a front surface covered with a solder mask at selected locations. The front surface not covered by the solder mask are formed with a plurality of lead layers and die pad layers. The top side of the die pad layer adheres to a chip. The chip and lead layers are connected electrically by a plurality of bonding wires. The chip, bonding wires, solder mask, lead layer and die pad layer are covered by a molded resin. After the package is singulated, the interim substrate is removed by etching to form the semiconductor package without substrate.

14 Claims, 8 Drawing Sheets

SEMICONDUCTOR PACKAGE WITHOUT SUBSTRATE AND METHOD OF MANUFACTURING SAME

FIELD OF THE INVENTION

This invention relates to a structure of semiconductor package without substrate and particularly a semiconductor package which has no substrate for reducing the package thickness and enhancing production yield and method of manufacturing same.

BACKGROUND OF THE INVENTION

The commonly used semiconductor packaging process generally includes the following steps: In dicing saw process, the wafer was cut into individual chip by means of wafer dicing machines according to a preset integrated circuit (IC) street mapped on the wafer; In die bonding process, the chip was mounted on a prefabricated lead frame or substrate; In wire bonding process, the chip and the lead were connected electrically by means of bonding wires such as gold (Au) wires, copper (Cu) wires or aluminum (Al) wires, then molding the chip and bonding wires in a package by molded resin for protecting the semiconductor from damping, contamination or damage.

With increasing demands of enhancing function and speed for the electronic products, there is a constant pressure to build and pack more circuit elements in the IC. The size of the chip thus becomes bigger. However one of the contemporary design requirements for electronic products need slim size and light weight. Hence wafer producers are under great pressure to increase circuit density in IC chip including more function but without increasing the IC dimension. The chip package also has to meet this trend of slim size and light weight for saving space in the circuit board for semiconductor devices. Numerous package techniques and methods have been proposed for meeting this requirement.

FIGS. 1A and 1B illustrate a conventional semiconductor package method named quad flat non-leaded (QFN) package. The chip 1 is adhered to a die pad 32 located on a prefabricated lead frame 3 by silver paste 2, and the chip 1 is connected to a lead 31 through bonding wires 5 in wire bonding process. Thereafter, a molding process is performed. As the QFN package has only a half covered by molded resin 6, said lead 31 exposed outside the bottom side of the lead frame 3 is prone to form a flash 7 after the molding process. As a result, the subsequent manufacturing processes might be adversely affected.

For preventing the flash 7 from taking place, a conventional method is to adhere a high-temperature-resistant tape 8 to the bottom side of the lead frame 3 (shown in FIG. 2A). After the wire bonding process, the lead frame 3 stuck with the tape 8 is transported to the molding process. When the molding process is finished and the molded resin 6 is solidified, the tape 8 is removed (shown in FIG. 2B). This method needs additional steps of adhering the tape 8 to the lead frame 3 and removing the tape 8 later. This additional process makes production cost higher. Furthermore, as the tape 8 is a pliable material without hard and rigid property, it has a buffer effect on the lead frame 3 during wire bonding process, such as in thermo sonic (T/S) process or thermo compress (T/C) process, and may result in not even transmission of bonding force. Consequently, the bonding force might be negatively impacted and result in dropping of bondability.

FIG. 3 depicts another common problem happened to conventional wire bonding process. During the process, the lead frame 3 is placed on a heat block 9 and is held thereon by a window clamp 10 at the upper side for holding the lead 31 securely. Then the upper side of the chip 1 and the lead 31 are electrically connected by bonding wires 5 at two ends thereof. As the lead 31 of the QFN package product generally has a smaller surface and finer pitch, it is more difficult to securely hold the lead 31 between the heat block 9 and window clamp 10 during wire bonding process. The lead 31 tends to vibrate during the wire bonding process and may result in poorer bondability.

Moreover, every product needs a unique lead frame 3 for supporting and wiring the chip 1. It takes more time and cost in design and production. The lead frame 3 also takes considerable size and height in a finished package. This becomes another concern in designing slim and light products.

U.S. Pat. No. 5,869,905 discloses a semiconductor package structure which omits the lead frame for saving the package height. It includes a substrate which has a surface larger than the chip. The substrate has a through-hole for holding the back side of the chip on the substrate by vacuum suction force through the through-hole. In wire bonding process, the upper side of the chip and the substrate are connected by bonding wires. After the molding process in which the chip and bonding wires are encapsulated by a molding compound, the perforated substrate is removed for getting a package which has the bonding wires exposed directly to the surface of the molding compound.

Because of no substrate, the U.S. Pat. No. 5,869,905 package has a smaller size. However it still has the following disadvantages:

1. Holding the chip by vacuum suction force needs high precision equipment. A slight surface defect or not smoothness on the chip could cause chip displacement and may affect subsequent wire bonding process.
2. During wire bonding process, the bonding wires are directly soldered to the surface of the substrate, but the chip and substrate are not permanently engaged with each other (i.e. a temporarily engagement by vacuum force). The chip and substrate are easy to produce relative displacement when subject to an external force. This may cause break down of the bonding wire joints and form a flash in molding process.
3. The package loses a significant heat dissipating channel because of the omission of the lead frame.
4. The bonding wires are exposed to the surface of the molded resin after the package is completed. The exposed bonding wire is too small and is difficult for soldering on a circuit board in subsequent processes. To increase the soldering size will need additional process after the package is finished which will result in higher cost.

SUMMARY OF THE INVENTION

In view of the foregoing disadvantages, it is therefore an object of this invention to provide a structure and production method for semiconductor package which has no substrate so that flash may be prevented from happening to the exposed lead.

It is another object of this invention to eliminate the adhesive tape for improving the flash phenomenon and to provide a higher rigid substrate for wire bonding process, so that the bonding force may be fully transmitted to increase bondability.

It is a further object of this invention to provide a thin lead layer to replace conventional lead frame for engaging with a substrate to reduce total package thickness, and to hold the chip without the conventional clamping means so that the chip and lead won't vibrate during wire bonding process, and the package may has a heat dissipating channel to facilitate subsequent manufacturing processes.

It is yet another object of this invention to provide a simple structure and method for improving the packaging process, and enhancing product quality and production yield.

In order to achieve aforesaid objects, this invention provides an interim substrate covered by a solder mask at selected areas. The surface of the interim substrate that are not covered by the solder mask have a plurality of lead layers and die pad layers formed thereon at selected locations. The interim substrate provides a firm support base for bonding wires soldering on the lead layers during wire bonding process. After molding process is completed, and singulation processes are finished, the interim substrate is removed by etching process.

BRIEF DESCRIPTION OF THE DRAWINGS

The invention, as well as its many advantages, may be further understood by the following detailed description and drawings, in which.

DESCRIPTION OF THE PREFERRED EMBODIMENTS

Figure 1:
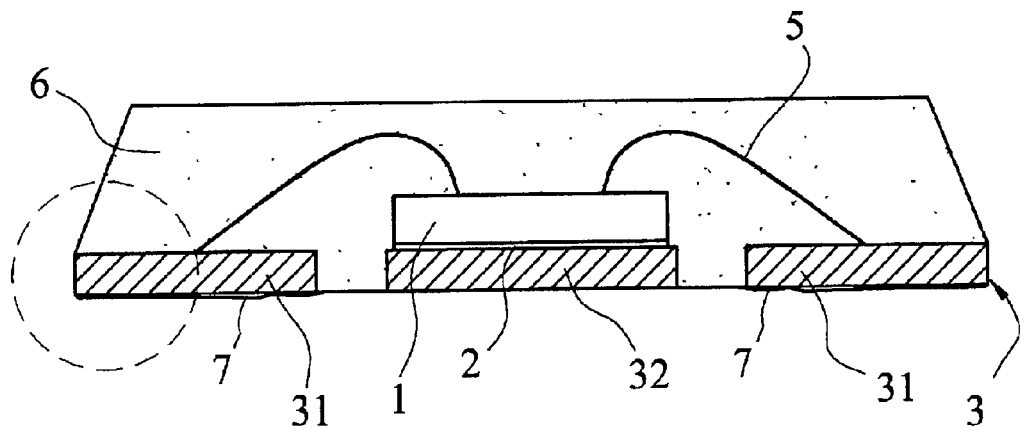
FIGS. 1A and 1B are schematic views of a conventional semiconductor package structure, with an enlarged fragmentary view of flash phenomenon.
Figure 1:
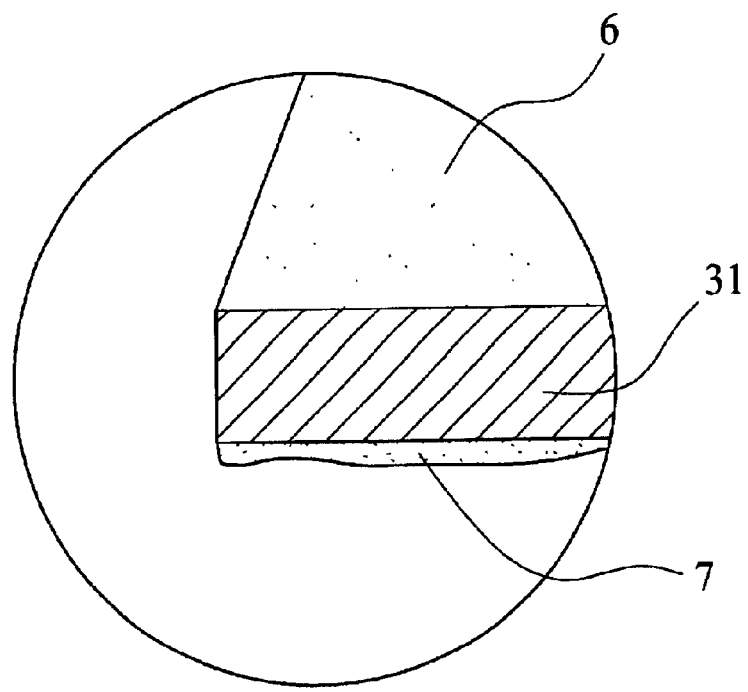
Figure 2:
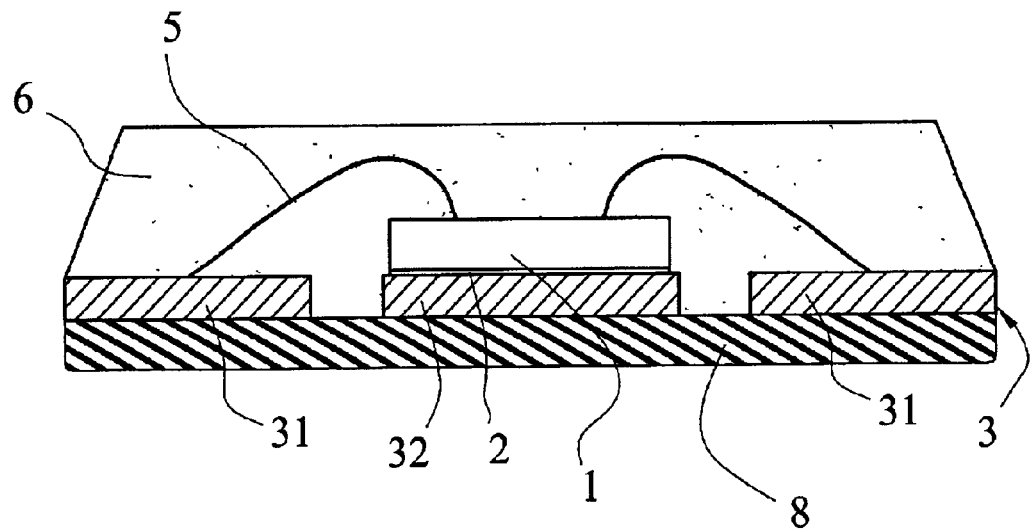
FIGS. 2A and 2B are schematic views of a conventional scheme for preventing flash.
Figure 2:
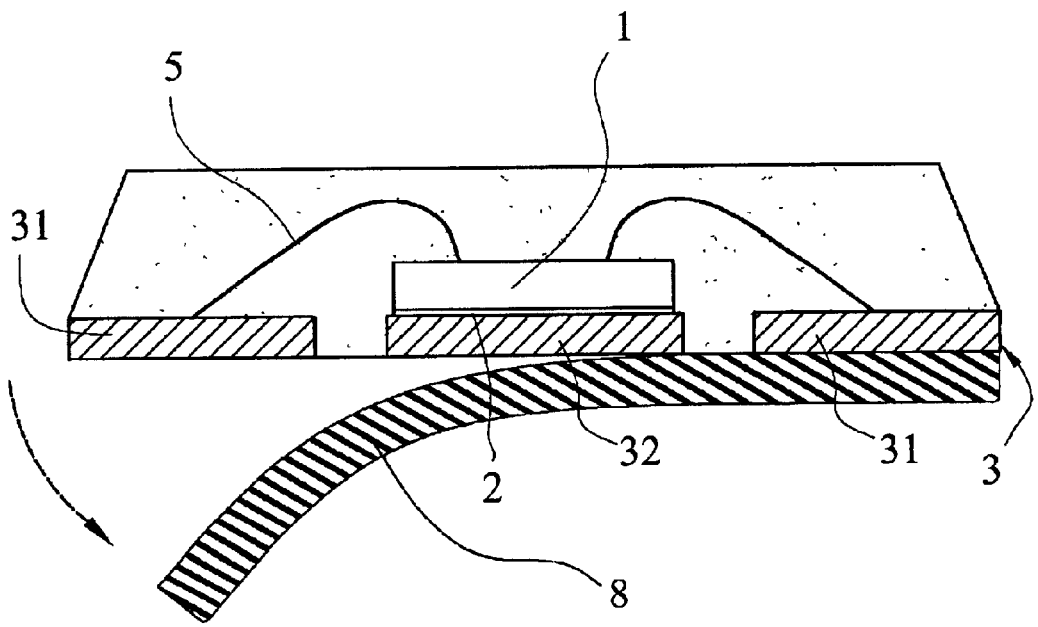
Figure 3:
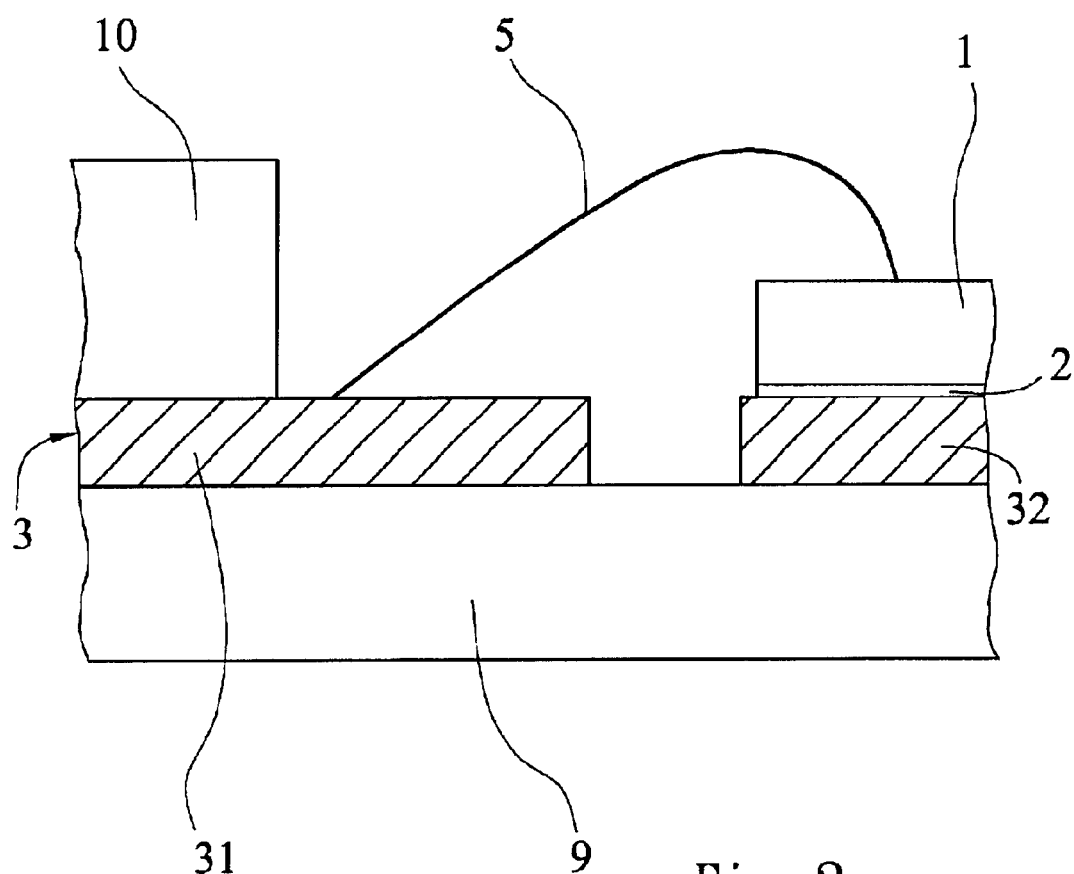
FIG. 3 is a schematic view of a conventional scheme for holding the lead.
Figure 4:
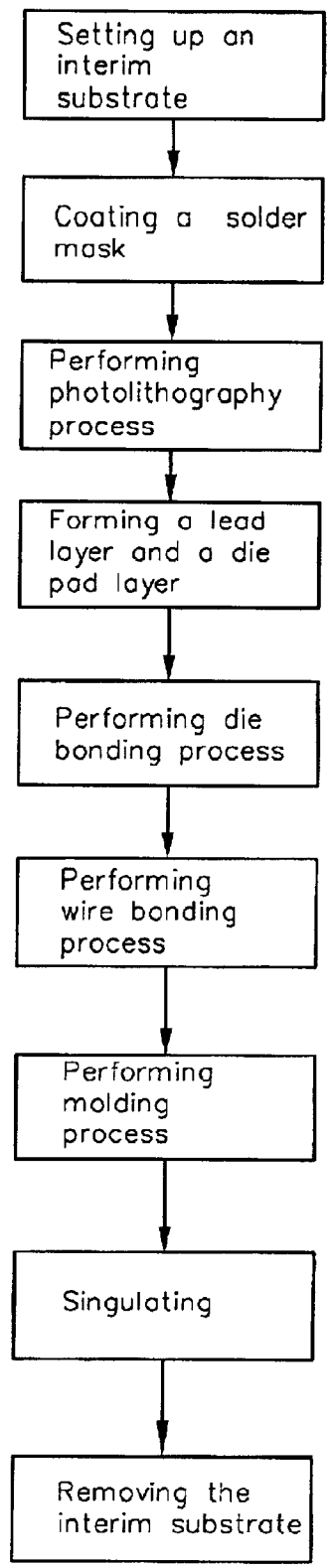
FIG. 4 is the process flow chart of this invention.

Referring to FIG. 4, the process according to the method of this invention includes the following steps: set up an interim substrate of a selected thickness made of copper; coat the surface of the interim substrate with a solder mask which is a layer of polyimide or ultraviolet (UV)-curable resin; perform photolithography process on the coated substrate to form a patterned solder mask; plate the interim substrate with conductive materials such as nickel (Ni) and gold to form a lead layer and a die pad layer; perform die bonding, wire bonding and molding processes; singulate the package; and etch the interim substrate to get a semiconductor package without substrate.

Figure 5:
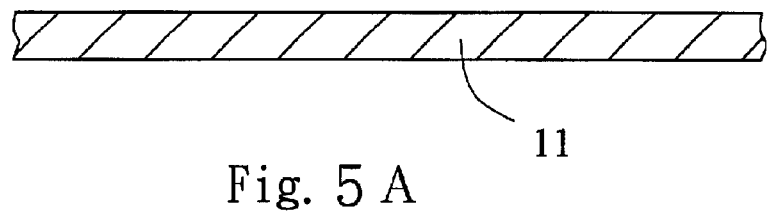
FIGS. 5A through 5H are schematic views of the process steps of this invention.
Figure 5:
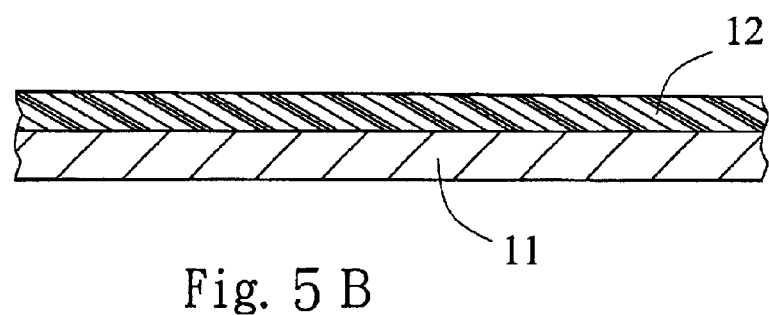
Figure 5:
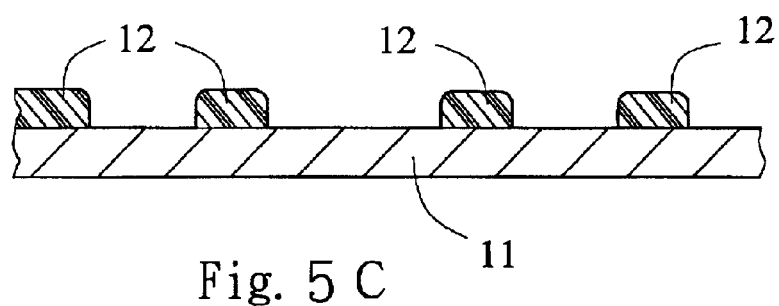
Figure 5:
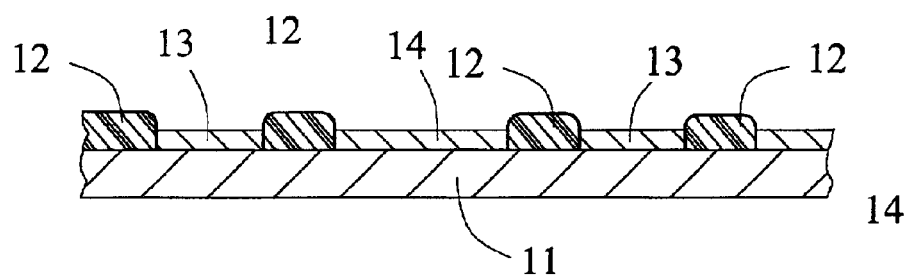
Figure 5:
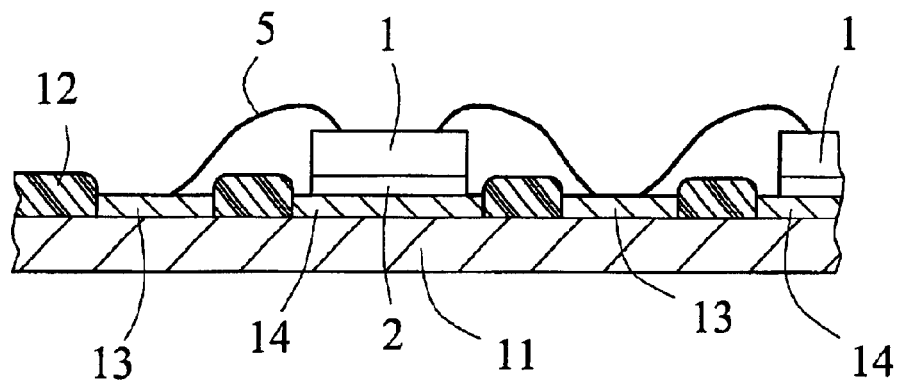
Figure 5:
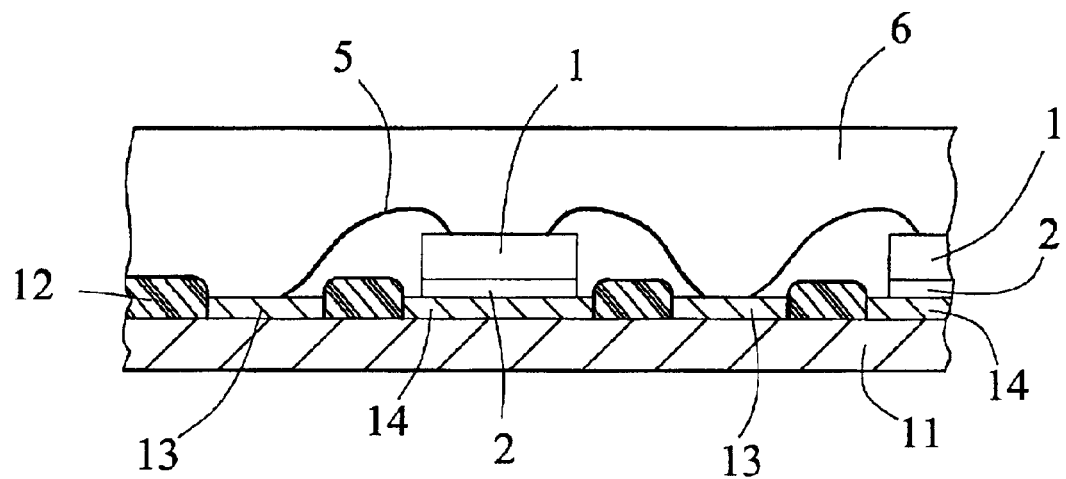
Figure 5:
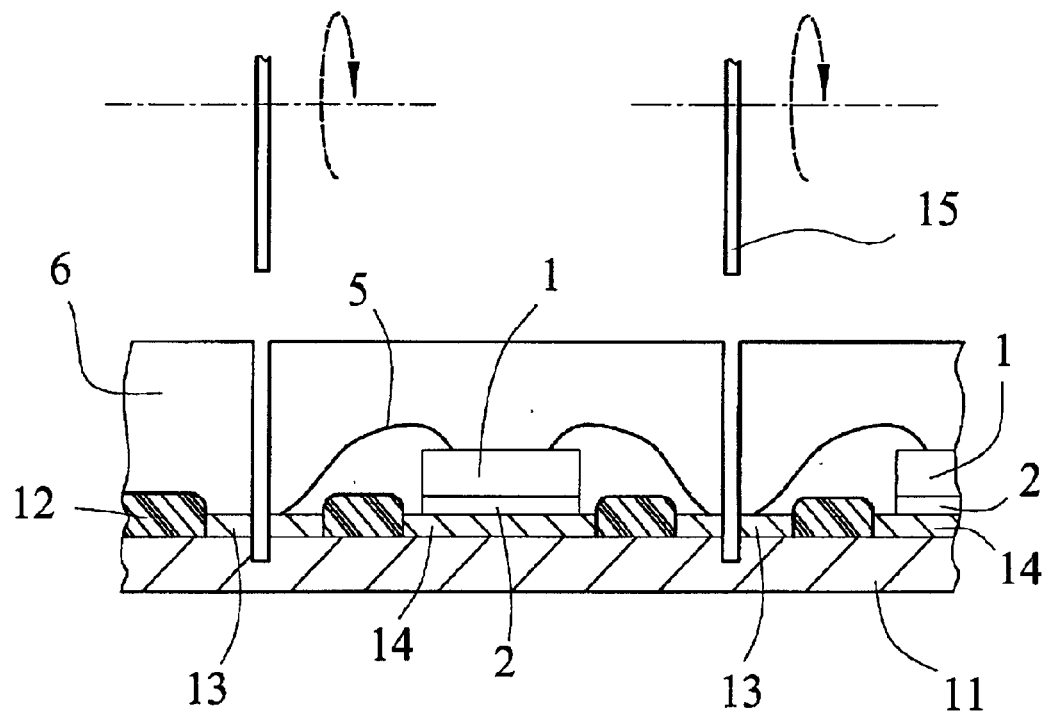
Figure 5:
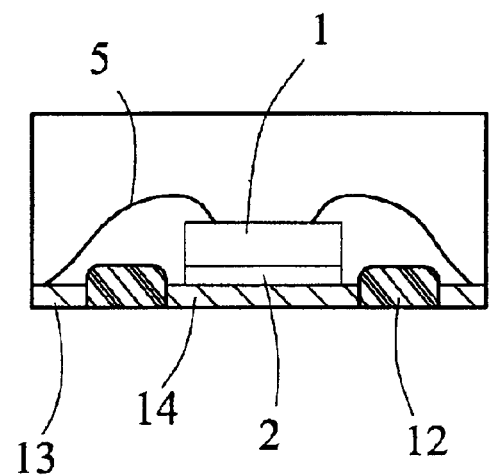

FIGS. 5A through 5H illustrate the embodiment of the process steps set forth above. Referring to FIG. 5A, prepare an interim substrate 11 by selecting a copper of a desired thickness which has a flat surface. Referring to FIG. 5B, coat and cover the surface of the interim substrate 11 with a layer of photosensitive insulation material of a selected thickness such as polyimide or UV-curable resin to form a blank solder mask 12 thereon. Referring to FIG. 5C, perform photolithography process by projecting UV light through a mask which has selected circuit patterns upon the blank solder mask 12. After photography developing process, the solder mask 12 will cover only selected areas of the surface of the interim substrate 11, and the non-covered areas are exposed to the surface of the interim substrate 11. Referring to FIG. 5D, evenly form a lead layer 13 and a die pad layer 14 on the exposed surface areas of the interim substrate 11 by plating conductive materials such as nickel and gold. The lead layer 13 and die pad layer 14 have respectively a smaller thickness than the solder mask 12. Referring to FIG. 5E, perform die bonding process by adhering the back side of the chip 1 with silver paste 2 for sticking to the surface of the die pad layer 14, then perform wire bonding process for soldering the upper sides of the chip 1 and lead layer 13 with a bonding wire 5 made of gold, copper or aluminum to establish electrical connection between the chip 1 and lead layer 13. Referring to FIG. 5F, encapsulate the chip 1, die pad layer 14, solder mask 12, lead layer 13 and bonding wires 5 with molded resin 6, and solidify the resin to form a package through molding process. Referring to FIG. 5G, singulate package by means of cutting tools 15 along a preset street into the solidified molded resin 6 to a selected depth below the top surface of the interim substrate 11 without hurting the chip 1 and bonding wires 5, the singulated package remains on the interim substrate 11. Referring to FIG. 5H, remove the copper-based interim substrate 11 by etching process and expose the solder mask 12, lead layer 13 and die pad layer 14 to the bottom surface of the package for forming the finished semiconductor package without substrate.

Figure 6:
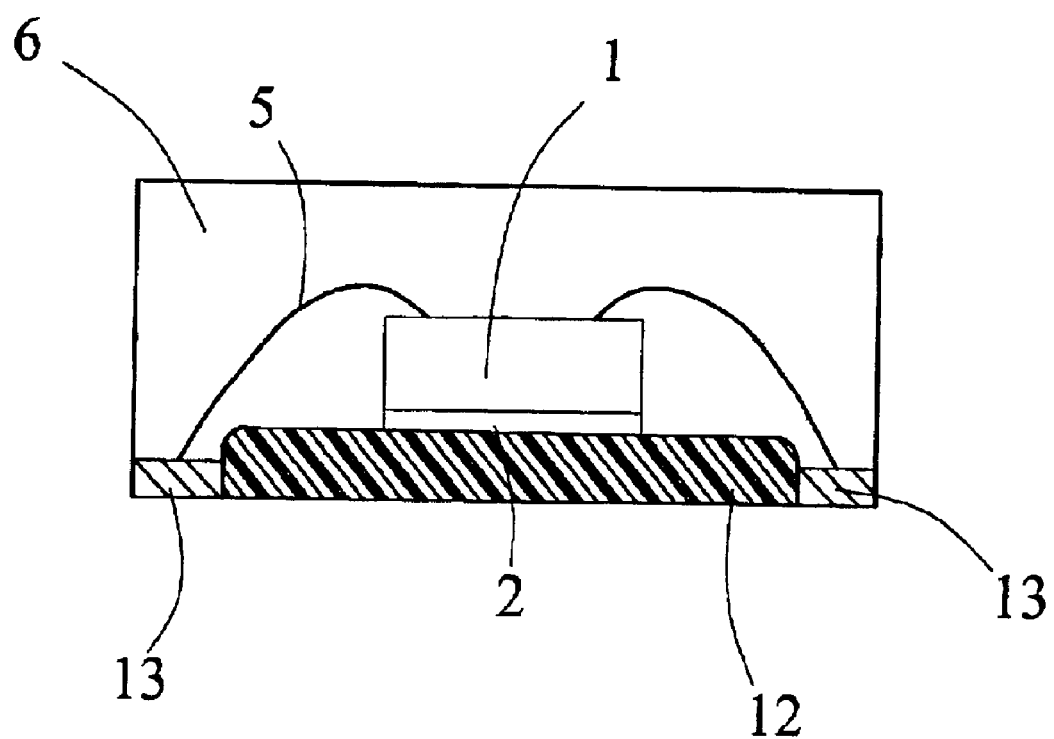
FIG. 6 is a schematic view of another embodiment of this invention.

FIG. 6 depicts another embodiment of this invention which is largely constructed and produced like the one shown in FIGS. 5A through 5H. However during the solder mask 12 formation process, the photo mask pattern used in the photolithography process is changed for forming the solder mask 12 on the area previously reserved for the die pad layer 14 (the solder mask 12 is produced like the one set forth above, thus will be omitted herein). The lead layer 13 remains the same. The chip 1 is adhered to the surface of the solder mask 12 by silver paste 2. By similar molding process to encapsulate the chip 1, solder mask 12, lead layer 13 and bonding wires 5 with molded resin 6, and singulation process to expose the solder mask 12 and lead layer 13 to the bottom surface of the package, a semiconductor package without substrate may be obtained.

In the wire bonding process set forth above, the existing of the copper-based interim substrate 11 may provide the lead layer 13 a firm metal support base. Hence the bonding force occurred during the wire bonding process can be transmitted fully and effectively. The chip 1 may also be held securely on the interim substrate 11 without producing displacement when subject to external force. The wire bonding process thus may proceed steadily with higher bondability. Furthermore, during the molding process, because the solder mask 12, lead layer 13 and die pad layer 14 are tightly engaged with the interim substrate 11, the molded resin 6 may be prevented from spilling over to the bottom surface of the lead layer 13 and die pad layer 14, thus the flash phenomenon may be avoided. In addition, the lead layer 13 and die pad layer 14 are formed on the surface of the interim substrate 11 by plating of gold and nickel, their thickness is smaller than conventional lead frame. They also provide a heat dissipating channel. In the structure of this invention, the lead layer 13 is exposed to the bottom surface of the whole semiconductor package and may provide surface area needed for subsequent process of soldering to the circuit substrate.

It may thus be seen that the objects of the present invention set forth herein, as well as those made apparent from the foregoing description, are efficiently attained.

While the preferred embodiments of the invention have been set forth for purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A single semiconductor package consisting of a single layer linearly consisting of at least two solder mask portions formed at selected locations, and between and adjacent said solder mask portions is a die pad portion of said layer contiguous to each solder mask portion; and lead portions of said layer adjacent to and contiguous to said solder mask portions, said die pad portion has a chip adhering to the die pad surface; a plurality of conductive elements are electrically connecting the chip and the lead portions of the layer; and a molded resin supporting and covering the chip, conductive elements, solder mask portions, lead portions of the layer and die pad portion of the layer; with the provision that except for support provided by said molded resin, no other support is provided for said chip adhered to the die pad surface, conductive elements connected to said chip and to said lead portions of the layer, solder mask portions, lead portion of the layer and die pad portion of the layer;

and with the further provision that the solder mask portions, lead portion of the layer and the die pad portion of the layer have a coplanar bottom surface which is not in contact with said molded resin.

2. The semiconductor package of claim 1, wherein the solder mask is made from photosensitive and insulative materials selected from the group consisting of polyimide and ultraviolet-curable resins.

3. The semiconductor package of claim 2, wherein the lead layer and die pad layer are made of conductive materials selected from the group consisting of nickel and gold.

4. The semiconductor package of claim 2, wherein the solder mask is of polyimide or ultraviolet-curable resin layer.

5. The semiconductor package of claim 1, wherein the lead layer and die pad layer are formed by plating.

6. The semiconductor package of claim 1, wherein the conductive elements are made of a material selected from the group consisting of gold, copper and aluminum.

7. The semiconductor package of claim 1, wherein the die pad layer is replaced by a solder mask.

8. A single semiconductor package consisting essentially of a single layer linearly consisting essentially of at least two solder mask portions formed at selected locations, and between and adjacent said solder mask portions is a die pad portion of said layer contiguous to each solder mask portion; and lead portions of said layer adjacent to and contiguous to said solder mask portions, said die pad portion has a chip adhering by a silver paste to the die pad surface; a plurality of conductive elements are electrically connecting the chip and the lead portion of the layer; and a molded resin supporting and covering the chip, conductive elements, solder mask portions, lead portions of the layer and die pad portion of the layer; with the provision that except for support provided by said molded resin, no other support is provided for said chip adhered to the die pad surface, conductive elements connected to said chip and to said lead portions of the layer, solder mask portions, lead portion of the layer and die pad layer;

and with the further provision that the solder mask portions, lead portions of the layer and the die pad layer have a coplanar bottom surface which is not in contact with said molded resin.

9. The semiconductor package of claim 8, wherein the solder mask is made from photosensitive and insulative materials selected from the group consisting of polyimide and ultraviolet-curable resins.

10. The semiconductor package of claim 8, wherein the lead layer and die pad layer are made of conductive materials selected from the group consisting of nickel and gold.

11. The semiconductor package of claim 8, wherein the solder mask is of polyimid or ultraviolet-curable resin layer.

12. The semiconductor package of claim 8, wherein the lead layer and die pad layer are formed by plating.

13. The semiconductor package of claim 8, wherein the conductive elements are made of a material selected from the group consisting of gold, copper and aluminum.

14. The semiconductor package of claim 8, wherein the die pad layer is replaced by a solder mask.

* * * * *

UNITED STATES PATENT AND TRADEMARK OFFICE
CERTIFICATE OF CORRECTION

PATENT NO.     : 6,770,959 B2
DATED          : August 3, 2004
INVENTOR(S)    : Chien-Ping Huang et al.

It is certified that error appears in the above-identified patent and that said Letters Patent is hereby corrected as shown below:

<u>Title page,</u>
Item [73], Assignee, should be corrected as follows:
-- Siliconware Precision Industries Co., Ltd., Taichung (TW) --.

Signed and Sealed this

First Day of November, 2005

JON W. DUDAS
*Director of the United States Patent and Trademark Office*